United States Patent [19]

Lendaro

[11] Patent Number: 5,157,353
[45] Date of Patent: Oct. 20, 1992

[54] AUDIO SYSTEM WITH TRANSIENT TRACKING DUAL VOLTAGE POWER SUPPLY

[75] Inventor: Jeffery B. Lendaro, Noblesville, Ind.

[73] Assignee: Thomson Consumer Electronics, Inc., Indianapolis, Ind.

[21] Appl. No.: 694,967

[22] Filed: May 3, 1991

[51] Int. Cl.⁵ .............................................. H03F 1/00
[52] U.S. Cl. .................................. 330/297; 330/202; 323/267
[58] Field of Search ............... 330/128, 148, 202, 275, 330/297, 301; 323/267; 363/63

[56] References Cited

U.S. PATENT DOCUMENTS

| | | | |
|---|---|---|---|
| 3,133,242 | 5/1964 | Harries | 323/267 |
| 3,747,008 | 7/1973 | Zaretsky | 330/148 X |
| 3,826,969 | 7/1974 | Eichelberger et al. | 323/267 |
| 4,283,673 | 8/1981 | Lieux | 323/267 X |
| 4,320,447 | 3/1982 | Krauss | 363/63 |
| 5,027,266 | 6/1991 | Ishii et al. | 363/63 |

FOREIGN PATENT DOCUMENTS 1136130  1/1985  U.S.S.R. .............................. 323/267

OTHER PUBLICATIONS

Balakrishnan, "Power GaAsFET Amplifier with Single Supply", *Electronic Engineering*, Nov. 1986, p. 40.

*Primary Examiner*—James B. Mullins
*Attorney, Agent, or Firm*—Joseph S. Tripoli; Peter M. Emanuel; Frederick A. Wein

[57] ABSTRACT

The present invention relates to electronic circuits, such as an operational amplifiers, which have dual power supply requirements. When the power supply voltages are switched between an "off" state and an "on" state, the power supply transient voltages of the two polarities closely track each othe so as to reduce audio transients from being produced within the operational amplifiers. This tracking is accomplished by the negative polarity power supply voltage being provided for the signal amplifier at the output terminal of an unity gain operational amplifier having an inverting input terminal coupled to the positive polarity power supply voltage.

5 Claims, 2 Drawing Sheets

AUDIO SYSTEM WITH TRANSIENT TRACKING DUAL VOLTAGE POWER SUPPLY

BACKGROUND

In stereo television receivers it is often desirable to have output terminals which can be coupled to an external power amplifier. In such a situation, it is very desirable that the system be "pop" or "thump" free when the television receiver is turned "on" or "off" with the external power amplifier being "on". This requires that the turning "on" and "off" of the television receiver not introduce any transient conditions producing audible signals.

Audible transients coming through the television output jacks typically have two sources, e.g., whatever is ahead of the output driver and the output driver itself. If the supplies to the output driver amplifier are carefully removed, there will be no audible transients produced. Prior art systems used soft starting regulators to try to keep the unbalance of the power supplies small. Because such soft starting regulators do not track exactly, they must be brought up or down in voltage slowly. A much more rapid power-up or power-down can be had with the circuit disclosed herein by forcing the plus and minus supplies to the output driver amplifier to closely track each other.

The present invention permits a plurality of loads to be coupled to the power supply since the plus or minus supplies will track each other regardless of the number of loads coupled to the power supply or the balance of the loading.

SUMMARY OF THE INVENTION

The present invention relates to electronic circuits, such as an operational amplifiers, which have dual power supply requirements. When the power supply voltages are switched between an "off" state and an "on" state, the power supply transient voltages of the two polarities are made to closely track each other so as to reduce audio transients from being produced within the operational amplifiers. This tracking is accomplished by the negative polarity power supply voltage being provided for the signal amplifier at the output terminal of a unity gain operational amplifier having an inverting input terminal coupled to the positive polarity power supply voltage.

DETAILED DESCRIPTION OF THE PREFERRED EMBODIMENT

Figure 1:
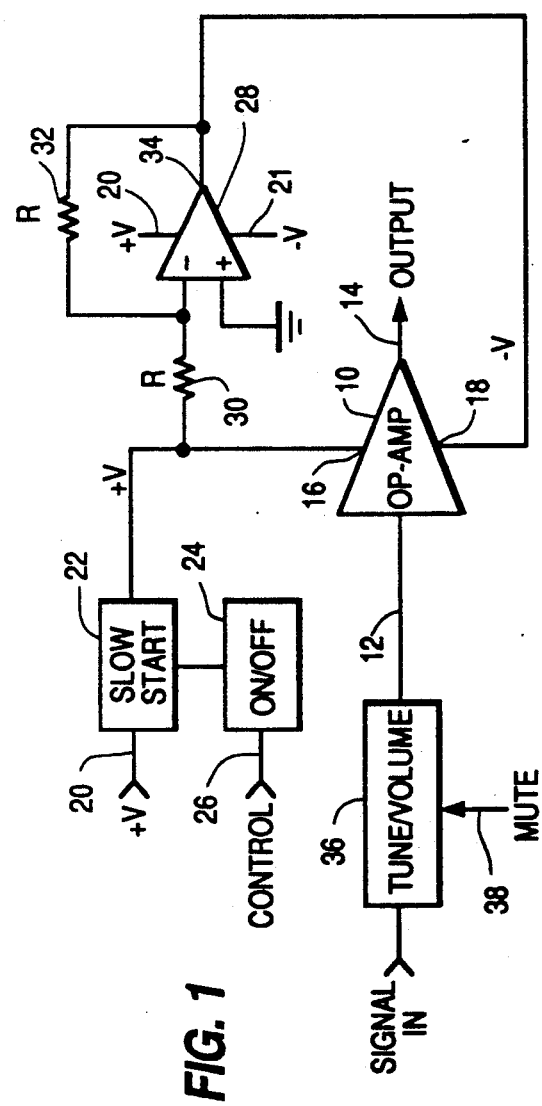
FIG. 1 shows a block diagram representation of an audio system according to aspects of the present invention.

Referring now to FIG. 1 there is shown a block diagram of the present audio system according to aspects of the present invention. Operational amplifier 10 has a signal input terminal 12, and a signal output terminal 14 for coupling to other external or internal amplifiers (not shown). Amplifier 10 is provided with a plus power supply voltage at terminal 16 and a negative power supply voltage at terminal 18. The plus voltage is provided from an external source (not shown) at line 20. It is to be understood that the plus voltage provided at line 20 can be a highly regulated and filtered. The supply voltage at line 20 is coupled to a "slow start" circuit 22 wherein "turn on" and "turn off" times are made less sudden by a time constant circuit. Circuit 22 is controlled in response to an "on/off" signal coupled from circuit 24 which operates in response to a control signal provided at line 26. The control signal at line 26 is derived from a microprocessor (not shown) or other suitable source.

The negative power supply voltage at terminal 18 is provided by an operational amplifier 28 with the plus supply voltage coupled to the inverting input through a source resistor 30. A feedback resistor 32 of value equal to resistor 30 is coupled between the output of operational amplifier 28 and the inverting input so that operational amplifier 28 has unity gain in the inverting configuration. Operational amplifier 28 is itself powered by an external dual power supply (not shown) such as the plus power supply voltage provided at line 20 and a negative supply voltage provided at line 21. Since the plus power supply voltage applied to terminal 16 is applied to the inverting terminal of amplifier 28 which has unity gain, the DC voltage at output terminal 34 is equal in amplitude to the voltage at terminal 16 but of a negative polarity due to the inversion. Thus, the negative and plus power supply voltages applied to amplifier 10 are equal in magnitude, and any transient changes in the plus voltage will be followed by the negative voltage.

Figure 2:
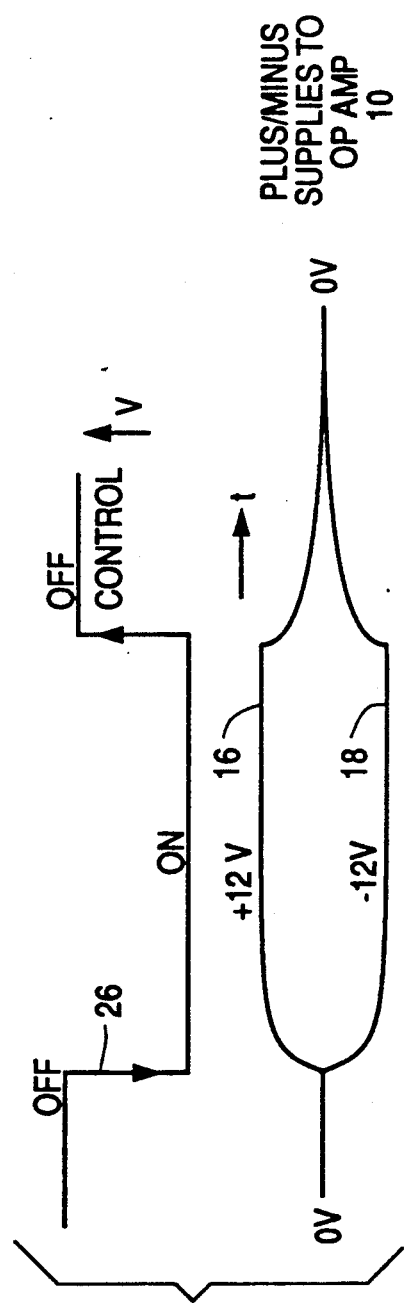
FIG. 2 shows a graphic representation of the timing and relative magnitudes of voltages of the block diagram of FIG. 1.

FIG. 2 shows a timing diagram of the control signal at terminal 26 and the power supply voltages at terminals 16 and 18. This drawing shows that when the control line 26 in an "off" signal condition, (high) the supply voltages at lines 16 and 18 are also "off" (low). When the control line 26 goes "on" (low), the plus power supply voltage at line 16 rises in a smooth transient manner and the negative voltage at line 18 follows so that the turn-on voltages for plus and minus polarity track each other. Upon a "turn-off" signal applied to line 26, the positive voltage at line 16 starts to decay towards zero and the decay is followed by the negative voltage at line 18.

In the exemplary embodiment, the control voltage at line 26 is provided by a microprocessor (not shown). In order to provide tracking between the plus and negative supply voltages it is necessary that the supply voltage at terminal 20 be present and that the +V and −V supply voltages to amplifier 28 also be present during power-up and power-down of amplifier 10. This is because amplifier 28 must remain operational in order to provide the tracking of the negative voltage at line 18 with the plus voltage at line 16. The microprocessor must also remain functional. Accordingly, if the television receiver is to be powered down (the supply voltage at terminal 20 switched to zero volts), then the control signal to turn operational amplifier 10 "off" should be applied a period of time prior to the time at which main power down status is implemented, typically 40 milliseconds before. This time relationship between the control signal at line 26 and the powering down of the main power can be provided by the aforementioned microprocessor (not shown). Similarly on power up, it is necessary that the main power supplies be functioning prior to the generation of the control signal at line 26 for tuning amplifier 10 "on".

The mute signal at terminal 38 is provided to assure that no transient signals are provided by circuitry preceding circuit 36 when power supply operations are being performed. Accordingly, the mute signal at terminal 38 is provided for muting till shortly after operational amplifier 10 becomes operational and shortly before amplifier 10 is turned "off" by control signal at line 26. Thus, receiver turn-off transients generated by the circuitry preceding amplifier 10 during power down are also suppressed by amplifier 10 already being non-operational. The turn-on transients are suppressed by amplifier 10 remaining non-operational until after the main power supply is turned "on".

Figure 3:
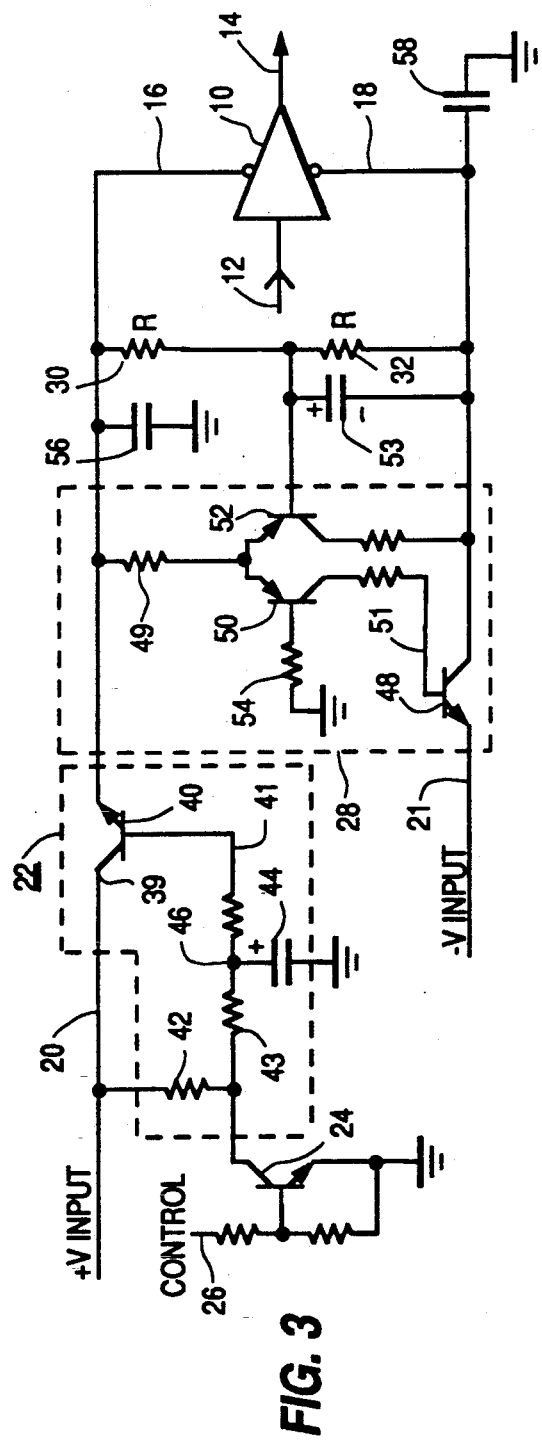
FIG. 3 shows a schematic diagram of the exemplary implementation of portions of the block diagram of FIG. 1.

FIG. 3 shows the schematic of the implementation of the block diagram of FIG. 1. The plus voltage supply at line 20 is coupled to the collector electrode 39 of NPN series control transistor 40. Transistor 40 which has the has its base electrode 41 coupled to the junction 46 of series connection of resistors 42 and 43, and capacitor 44, which time-constant circuit provides the slowing time constant for the plus supply voltage at line 16. In the "off" condition for amplifier 10, the voltage across capacitor 44 is kept low by the collector electrode of transistor 24, which transistor is kept in a saturated condition by a high control signal applied at line 26. With the voltage at node 46 being low, transistor 40 is non-conducting and there is no plus voltage applied to line 16. On the negative supply side, the negative supply line 21 is coupled to the emitter of NPN series control transistor 48 and the negative supply voltage at 21 is not coupled to line 18 until transistor 48 is made to conduct, as will be discussed below.

Upon the control signal at 26 going "low" so that the collector of transistor 24 goes high, capacitor 44 starts to charge through resistors 42 and 43 to the voltage at line 20. The values of resistors 42 and 43 and capacitor 44 are chosen to provide a relatively rapid rise in power supply voltage at lead 16 but with the sharp rise transient reduced. It should be noted that the discharge time constant for discharging capacitor 44 and turning "off" transistor 40 is determined by capacitor 44 and resistor 43. Thus, the turn-off time constant in response to the control signal at line 26 is faster than the turn-on time constant as discussed above. As the voltage on the base electrode 41 increases due to the charging of capacitor 44, transistor 40 starts to conduct and the positive voltage at lead 16 starts to rise. As the voltage at line 16 starts to rise, current flows through resistor 49 to the emitter of PNP transistor 50 having its base coupled to ground through resistor 54. The collector electrode of transistor 50 is coupled to a base electrode 51 of transistor 48 providing bias current to base electrode 51 causing transistor 48 to start to conduct thus providing a rising negative polarity voltage at line 18.

As the voltage at line 18 goes negative, PNP transistor 52, having its emitter electrode coupled to the junction of the emitter electrode of transistor 50 and resistor 49, also becomes operational. The base electrode of transistor 52 is coupled to the junction between the two equal valued resistors 30 and 32 coupled across lines 16 and 18 so that the base electrode of transistor 52 is at about ground potential as is the base electrode of transistor 50. Transistor 52 is arranged as a gain providing amplifier with resistor 32 being the feedback resistor of amplifier 28 as shown in FIG. 1. The output signal at the emitter of transistor 52 is coupled to the emitter electrode of transistor 50 for controlling the current into the base electrode 51 of transistor 48 so that the negative voltage at line 18 will follow the transient changes in the plus voltage at line 16. This following of transient changes in the plus voltage at line 16 by the negative voltage at line 18 is also effective upon turn-off since the following of the transient changes will continue for decreasing voltage at line 20 for as long as transistors 50 and 52 have enough voltage to remain operational.

Capacitor 53 across feedback resistor 32 rolls off the frequency response of the amplifier 28. Capacitors 56 and 58 AC couple respective voltage supply lines 16 and 18 to ground.

What is claimed is:

1. A power supply comprising:
a first voltage supply means for providing a first power supply voltage to a load including means for switching said first power supply voltage between an "on" mode and an "off" mode said means for switching including time-constant means for substantially slowing the transition of said first power supply voltage between the "on" and "off" modes, and a second voltage supply means comprising amplification means having a negative unity gain for providing a second power supply voltage of equal but opposite polarity to the first power supply voltage, the amplification means having an input coupled to the first power supply voltage and an output coupled to the load for providing the second power supply voltage to the load, a change of voltage of the first power supply voltage applied to the load due to said time-constant means being followed by a similar change of opposite polarity in the second power supply voltage applied to the load also due to said time-constant means.

2. A power supply comprising:
a first voltage supply means for providing a first power supply voltage to a load including means for switching said first power supply voltage between an "on" mode and an "off" mode, the first voltage supply means comprising time constant means for slowing the time for switching between modes and a second voltage supply means comprising amplification means having a negative unity gain for providing a second power supply voltage of equal but opposite polarity to the first power supply voltage, the amplification means having an input coupled to the first power supply voltage and an output coupled to the load for providing the second power supply voltage to the load, a change of voltage of the first power supply voltage applied to the load being followed by a similar change of opposite polarity in the second power supply voltage applied to the load, the load being an amplifier having a signal input means including means for muting the signal when the first power supply voltage is switched between the "on" mode and "off" mode.

3. An audio amplifier comprising:
amplification means for amplifying an input signal provided by an input signal means and providing an amplified output signal, a first voltage supply means coupled to the amplification means for providing a first power supply voltage to said amplification means, including means for switching said first power supply voltage between an "on" mode and an "off" mode, said means for switching including time-constant means for substantially slowing the transition of said first power supply voltage between the "on" and "off" modes, and a second voltage supply means comprising an amplifier having a negative unity gain for providing a second power supply voltage of equal but opposite polarity to the first power supply voltage, the amplifier having an input coupled to the first power supply voltage and an output coupled to the amplification means for providing the second power supply voltage to the amplification means, a change of voltage of the first power supply voltage applied to the amplification means due to said time-constant means being followed by a similar change of opposite polarity in the second power supply voltage being applied to the amplification means due to said time constant means.

4. An audio amplifier comprising:

amplification means for amplifying an input signal provided by an input signal means and providing an amplified output signal, a first voltage supply means coupled to the amplification means for providing a first power supply voltage to said amplfication means, including means for switching said first power supply voltage between an "on" mode and an "off" mode, said means for switching invluding time-constant means for substantially slowing the transition of said first power supply voltage between the "on" and "off" modes, and a second voltage supply means comprising an amplifier having a negative unity gain for providing a second power supply voltage of equal but opposite polarity to the first power supply voltage, the amplifier having an input coupled to the first power supply voltage and an output coupled to the amplification means for providing the second power supply voltage to the amplification means, a change in the first power supply voltage applied to the amplification means being followed by a similar change of opposite polarity in the second power supply voltage being applied to the amplification means due to said time constant means.

the signal input means including means for muting the input signal when the first power supply voltage is switched between the "on" mode and "off" mode.

5. An audio amplifier comprising:

amplification means for amplifying an input signal provided by an input signal means and providing an amplified output signal, a first voltage supply means coupled to the amplification means for providing a first power supply voltage to said amplification means, including means for switching said first power supply voltage between an "on" mode and an "off" mode, said first voltage supply means further comprising time constant means for slowing the time for switching between modes, and a second voltage supply means comprising an amplifier having a negative unity gain for providing a second power supply voltage of equal but opposite polarity to the first power supply voltage, the amplifier having an input coupled to the first power supply voltage and an output coupled to the amplification means for providing the second power supply voltage to the amplification means, a change of voltage of the first power supply voltage applied to the amplification means being followed by a similar change of opposite polarity in the second power supply voltage being applied to the amplification means due to the time constant means.

the amplification means including muting means for muting the input signal means when the first power supply voltage is switched between the "on" mode and "off" mode.

* * * * *